United States Patent
Yoshioka et al.

(10) Patent No.: US 6,844,274 B2
(45) Date of Patent: Jan. 18, 2005

(54) SUBSTRATE HOLDER, PLATING APPARATUS, AND PLATING METHOD

(75) Inventors: Junichiro Yoshioka, Tokyo (JP); Seiji Katsuoka, Tokyo (JP); Masahiko Sekimoto, Tokyo (JP); Yasuhiko Endo, Tokyo (JP); Yugang Guo, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/638,523

(22) Filed: Aug. 12, 2003

(65) Prior Publication Data

US 2004/0037682 A1 Feb. 26, 2004

(30) Foreign Application Priority Data

Aug. 13, 2002 (JP) ........................................ 2002-236094

(51) Int. Cl.[7] .......................... H01L 21/00; B25B 11/00; C25B 9/00
(52) U.S. Cl. ...................... 438/800; 269/21; 204/297.01
(58) Field of Search ................................. 438/678, 800; 269/21, 55; 211/41.18; 204/297.01, 297.03, 298.05; 118/500

(56) References Cited

U.S. PATENT DOCUMENTS

| 4,682,928 A | * | 7/1987 | Foulke et al. ........... 414/416.01 |
| 2002/0029963 A1 | * | 3/2002 | Yoshioka et al. ....... 204/224 R |

* cited by examiner

Primary Examiner—Matthew Smith
Assistant Examiner—Calvin Lee
(74) Attorney, Agent, or Firm—Wenderoth, Lind & Ponack, L.L.P.

(57) ABSTRACT

A substrate holder holds a substrate while hermetically sealing an outer circumferential edge and a reverse side of the substrate and exposing a surface of the substrate. The substrate holder has a base and a cover having an opening defined therein and positioned to place the substrate between the base and the cover. An attracting mechanism couples the base and the cover to each other to hold the substrate between the base and the cover, with the surface of the substrate being exposed through the opening.

6 Claims, 11 Drawing Sheets

F I G. 4
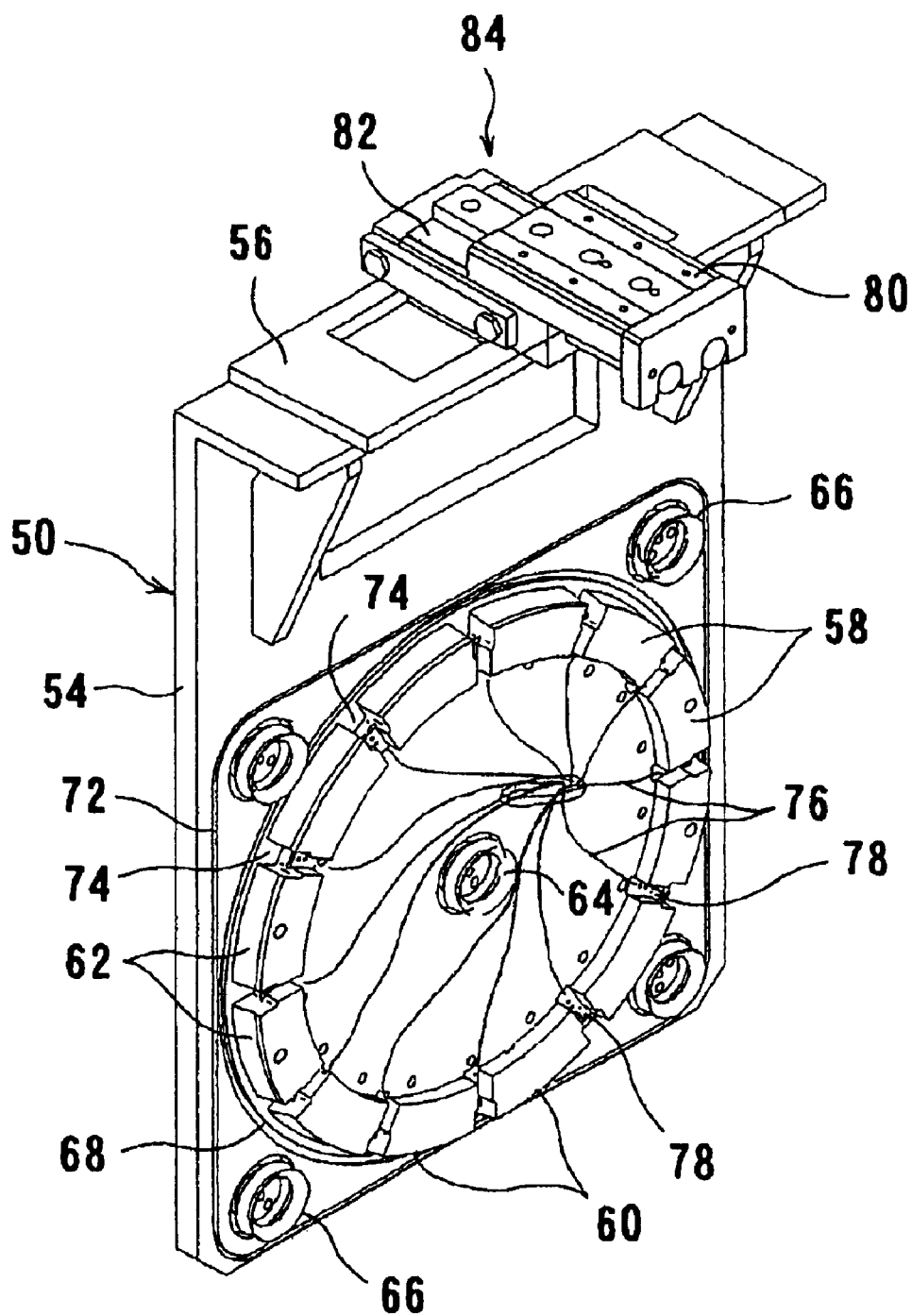

SUBSTRATE HOLDER, PLATING APPARATUS, AND PLATING METHOD

BACKGROUND OF THE INVENTION

1. Field of the Invention

The present invention relates to a substrate holder for use in a plating apparatus for plating a to-be-plated surface of a substrate, especially to form a plated film in fine trenches for interconnection, holes, and resist openings in the surface of a semiconductor wafer, or to produce bumps (protrusive electrodes) on the surface of a semiconductor wafer for electric connection to package electrodes or the like, a plating apparatus having such a substrate holder, and a plating method using such a substrate holder.

2. Description of the Related Art

In a TAB (Tape Automated Bonding) and a flip chip, for example, protrusive connection electrodes (bumps) of gold, copper, solder, or nickel, or layers thereof are formed at predetermined locations (electrodes) on the surface of a semiconductor chip with interconnections formed thereon, and the semiconductor chip is electrically connected to package electrodes or TAB electrodes by those bumps. There are various methods for forming these bumps, including electroplating method, vapor deposition method, printing method, and ball bump method. As the number of I/O terminals on semiconductor chips increases and the pitch thereof decreases, the electroplating method is finding more use in forming bumps because it can produce smaller bumps and provide relatively stable performance.

The electroplating method is available in different types in the art. One of those different electroplating methods is a spurting or cup method wherein a surface to be plated of a substrate, such as a semiconductor wafer or the like, is horizontally placed so as to face downwardly, and a plating solution is spurted from below. The other method is known as a dipping method wherein a substrate to be plated is vertically erected in a plating tank and a plating solution is introduced upwardly into the plating tank so as to overflow the plating tank when the substrate is dipped and plated in the plating solution flowing in the plating tank. The dipping method is advantageous in that it allows bubbles that would adversely affect the quality of the plated film to be easily removed, and the footprint is small. The dipping method is therefore considered to be suited for the bump plating in which holes to be filling by the plating are relatively large and which requires a fairly long plating time.

When using the dipping-type electroplating apparatus to form the bump the air bubbles can escape easily. Conventional electroplating apparatus for carrying out the dipping method have a substrate holder for detachably holding a substrate, such as a semiconductor wafer or the like, while sealing its outer circumferential edge and reverse side sealed, and exposing its surface to be plated. The substrate holder with the substrate held thereby is dipped in a plating solution to plate the surface of the substrate.

The substrate holder is required to reliably seal the outer circumferential edge of the substrate for preventing the plating solution from going there around to the reverse side of the substrate when the substrate holder holds the substrate. One known substrate holder has a pair of openable and closable supports (holding members) with a presser ring mounted on one of the supports. When the substrate is positioned between the supports, a rotary ring is rotated to press one of the supports toward the other, pressing a seal ring fixed to one of the supports against the outer circumferential edge of the substrate, thereby to seal the outer circumferential edge of the substrate and hold the substrate.

With the above conventional substrate holder, when the presser ring is rotated, one of the supports is pressed toward the other to hold the substrate. Upon rotation of the presser ring, the support is deformed, straining the seal ring which finds it considerably difficult to fully seal the outer circumferential edge of the substrate. Especially, when a plated film is to be embedded in fine recesses defined in the surface of the substrate, it is the general practice to use a highly permeative plating solution which can easily and reliably find its way into the fine recesses. Therefore, the use of such a highly permeative plating solution makes it more difficult to completely seal the outer circumferential edge of the substrate.

For successively plating a substrate and processing the substrate in connection with the plating process, it has been customary in the art to hold the substrate with a substrate holder and move the substrate holder with a transfer device successively through plating and processing tanks wherein the substrate held by the substrate holder is dipped in the plating solution and processing liquids.

If a small lot of substrate products are to be manufactured, and the substrate is held by the substrate holder and delivered to and processed by the processing tanks, then the transfer device tends to be large in size, and a substrate loading/unloading device is required for horizontally loading and unloading the substrate. As a result, the overall plating apparatus is liable to large in size.

SUMMARY OF THE INVENTION

It is therefore an object of the present invention to provide a substrate holder for detachably holding a substrate while reliably sealing the outer circumferential edge of the substrate, and a plating apparatus which is suitable for the production of a small lot of substrate products and can be reduced in size, and a plating method which is carried out by such a plating apparatus.

According to an aspect of the present invention, there is provided a substrate holder for holding a substrate, comprising: a seal ring for sealing an outer circumferential edge and a reverse side of the substrate, while exposing a surface to be plated of the substrate; a base; a cover having an opening defined therein; and an attracting mechanism for coupling the base and the cover to each other to hold the substrate positioned between the base and the cover, with the surface of the substrate being exposed through the opening.

The substrate holder can hold the substrate by attracting the cover to the base with the substrate sandwiched therebetween, without turning or twisting the cover with respect to the base. Therefore, when the substrate holder holds the substrate, the cover and components combined therewith are prevented from being unduly deformed and a seal ring is also prevented from being strained with the deformation of the cover, etc. Consequently, the seal ring can fully seal the substrate.

The attracting mechanism may comprise a vacuum attracting mechanism. The vacuum attracting mechanism can produce sufficient attractive forces for attracting the cover to the base. When the vacuum attracting mechanism is inactivated, the base and the cover are disconnected from each other, easily and reliably releasing the substrate therebetween.

The base preferably has a provisionally supporting mechanism for provisionally supporting the substrate on the base. The provisionally supporting mechanism provisionally supports the substrate on the base, after which the cover is attracted to the base for holding the substrate between the base and the cover. The provisionally supporting mechanism may comprise a suction cup of a vacuum-attracting type or the like, which may be positioned centrally on the base.

The substrate holder may further comprise a positioning mechanism disposed between the base and the cover for positioning the substrate disposed and held between the base and the cover. The positioning mechanism can automatically position the substrate in a predetermined position when the substrate is placed and then held between the base and the cover.

According to another aspect of the present invention, there is also provided a substrate holder for holding a substrate, comprising: a seal ring for sealing an outer circumferential edge and a reverse side of the substrate, while exposing a surface to be plated of the substrate; and a base and a cover lying vertically and confronting each other; wherein the base is adapted to attract the substrate in a vertical orientation under vacuum, and secure the cover to the base in covering relation to the surface of the substrate with the seal ring pressed against the substrate.

In the substrate holder according to the other aspect, the cover has a positioning mechanism for receiving and positioning the substrate attracted under vacuum by the base. The substrate is prevented from falling by gravity off the substrate holder by the positioning mechanism while the substrate is being positioned and held between the based and the cover.

According to still another aspect of the present invention, there is provided a plating apparatus for plating a substrate, comprising: a plating unit having a plating tank for containing a plating solution therein, a substrate holder for holding the substrate in a vertical orientation, and a vertically displacing mechanism for vertically dipping the substrate holder and the substrate held thereby in the plating solution in the plating tank; a loading/unloading station for loading and unloading the substrate; and a transfer device for transferring the substrate between the plating unit and the loading/unloading station.

If the plating apparatus has a plurality of such substrate holders associated with respective plating units and plates substrates which are being detachably held in the vertical orientation by the respective substrate holders, then plating apparatus is suitable for the production of a small lot of substrate products, for example, and may be relatively small in size.

In the above plating apparatus, the plating unit preferably has a water cleaning tank for cleaning the substrate with water contained therein. Thus, the substrate held in the vertical orientation by the substrate holder can be plated in the plating tank and subsequently cleaned in the water cleaning tank.

The plating apparatus may further comprises a rinser drier for rinsing and drying the substrate. Thus, the substrate held in the vertical orientation by the substrate holder can be plated and then successively rinsed and dried.

According to yet another aspect of the present invention, there is provided a method of plating a substrate, comprising: transferring the substrate to a plating unit with a transfer device; holding the substrate with a substrate holder which is supported on a vertically displacing mechanism of the plating unit; lowering the substrate with the vertically displacing mechanism to dip the substrate held by the substrate holder in a vertical orientation in a plating solution in the plating unit thereby to plate the substrate; lifting the substrate holder to bring the plated substrate out of the plating solution; and transferring the plated substrate from the substrate holder to the transfer device.

According to still yet another aspect of the present invention, there is provided a method of plating a substrate, comprising: attracting and holding a substrate transferred by a transfer device, with a substrate holder which lies vertically and is lifted; lowering the substrate holder to dip the substrate held by the substrate holder into a plating solution thereby to plate the substrate; lifting the substrate holder to bring the plated substrate out of the plating solution; and transferring the plated substrate from the substrate holder to the transfer device.

Each of the above methods may further comprise the step of cleaning the plated substrate in a water cleaning tank after the substrate holder is lifted to bring the plated substrate out of the plating solution.

Each of the above methods may further comprise the steps of cleaning the plated substrate received from the substrate holder, drying the cleaned substrate, and returning the dried substrate from the transfer device to a loading/unloading station.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 4 is a perspective view of a base of the substrate holder;

DETAILED DESCRIPTION OF THE PREFERRED EMBODIMENTS

Preferred embodiment of the present invention will be described with reference to FIGS. 1 through 11.

Figure 1:
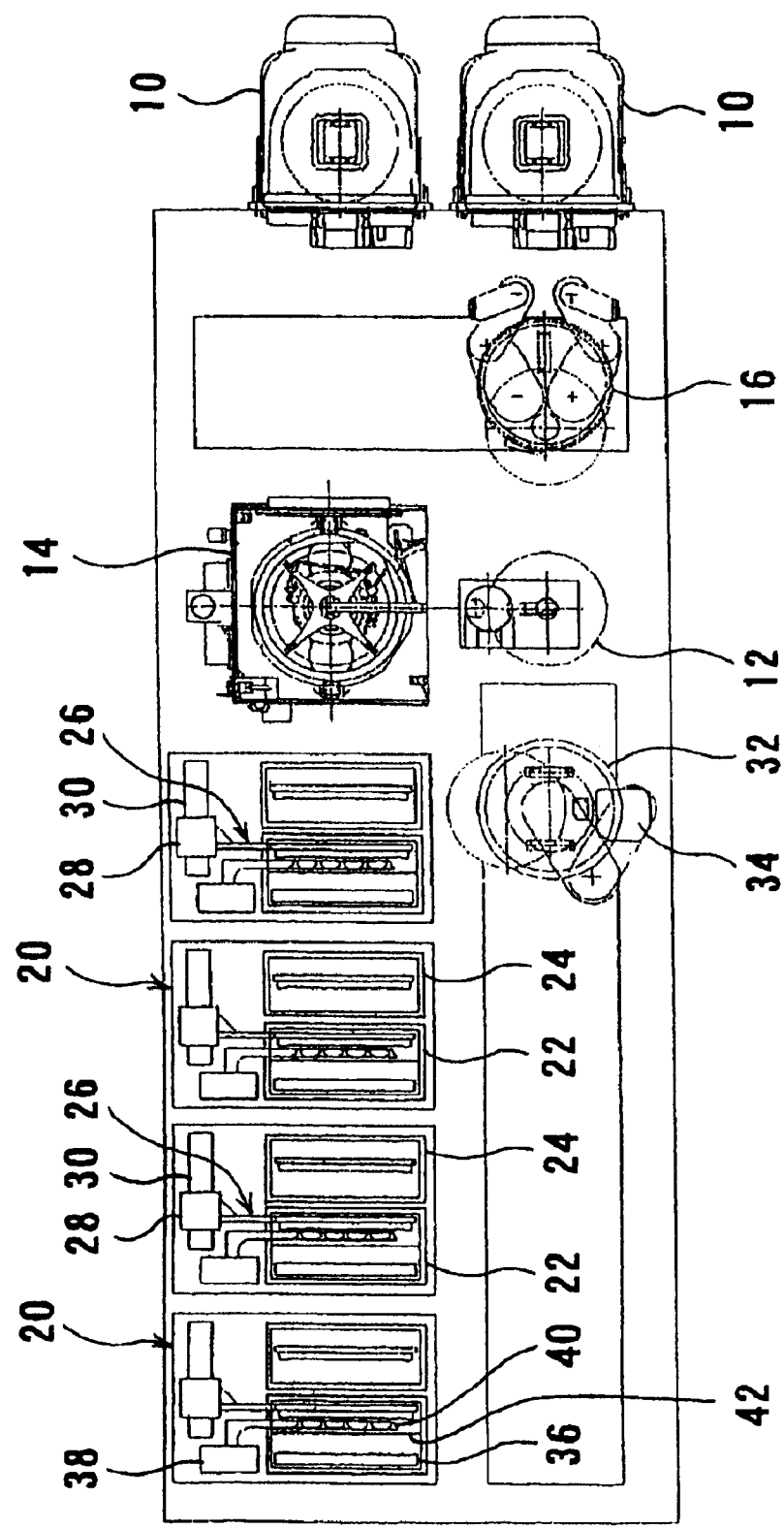
FIG. 1 is a plan view showing an overall layout of a plating apparatus according to an embodiment of the present invention.
Figure 2:
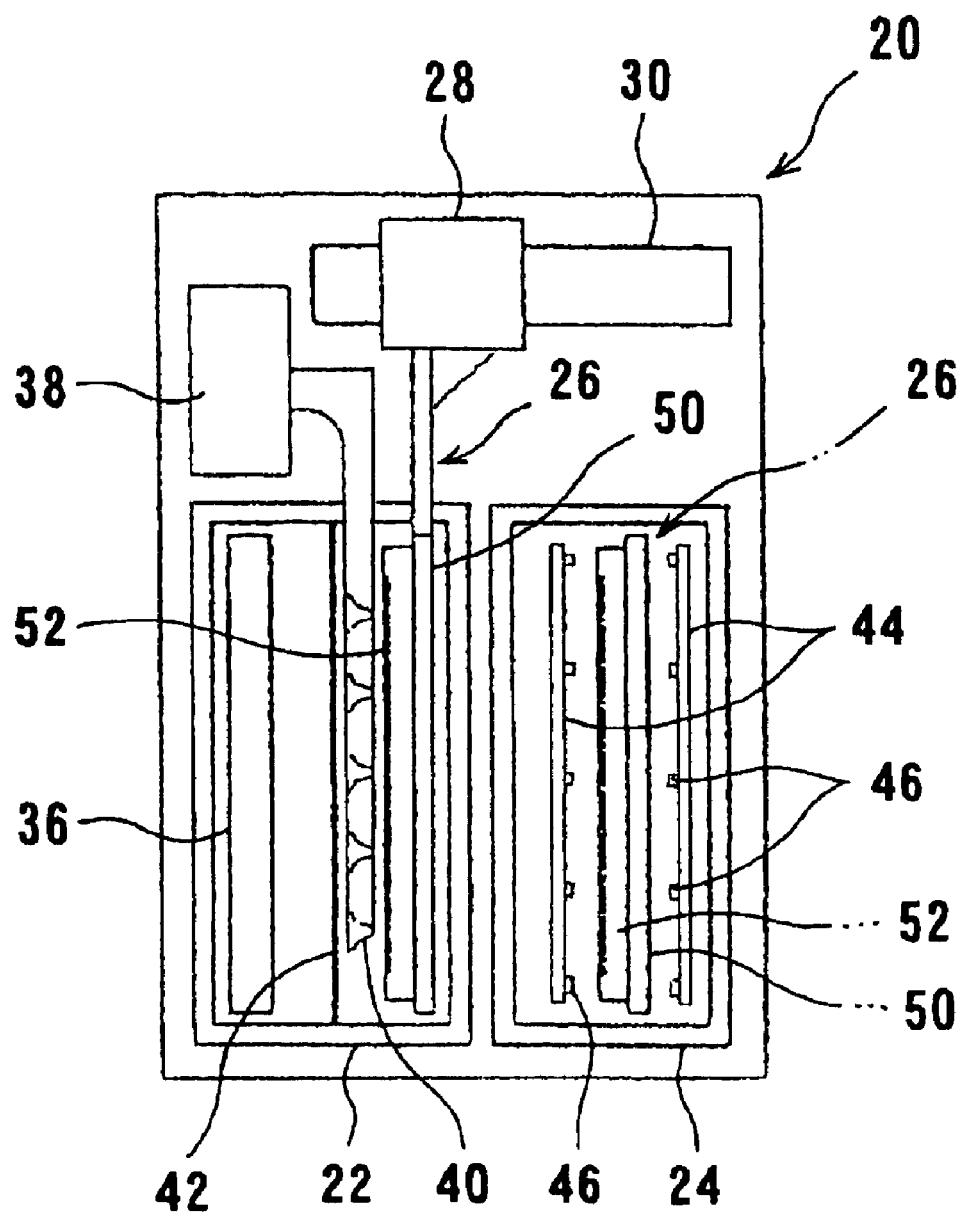
FIG. 2 is an enlarged plan view of a plating unit of the plating apparatus shown in FIG. 1.
Figure 3:
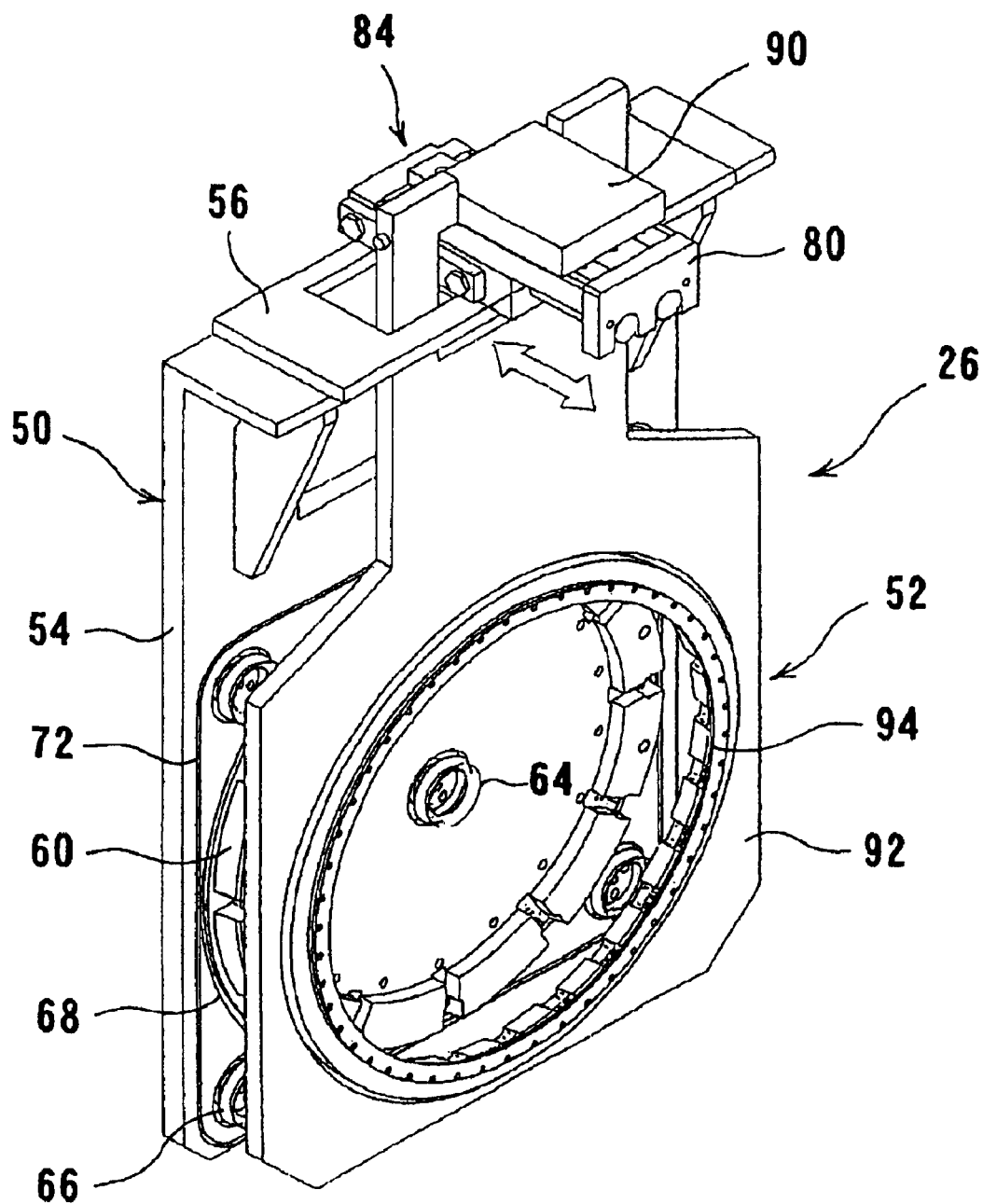
FIG. 3 is a perspective view of a substrate holder of the plating apparatus shown in FIG. 1.
Figure 5:
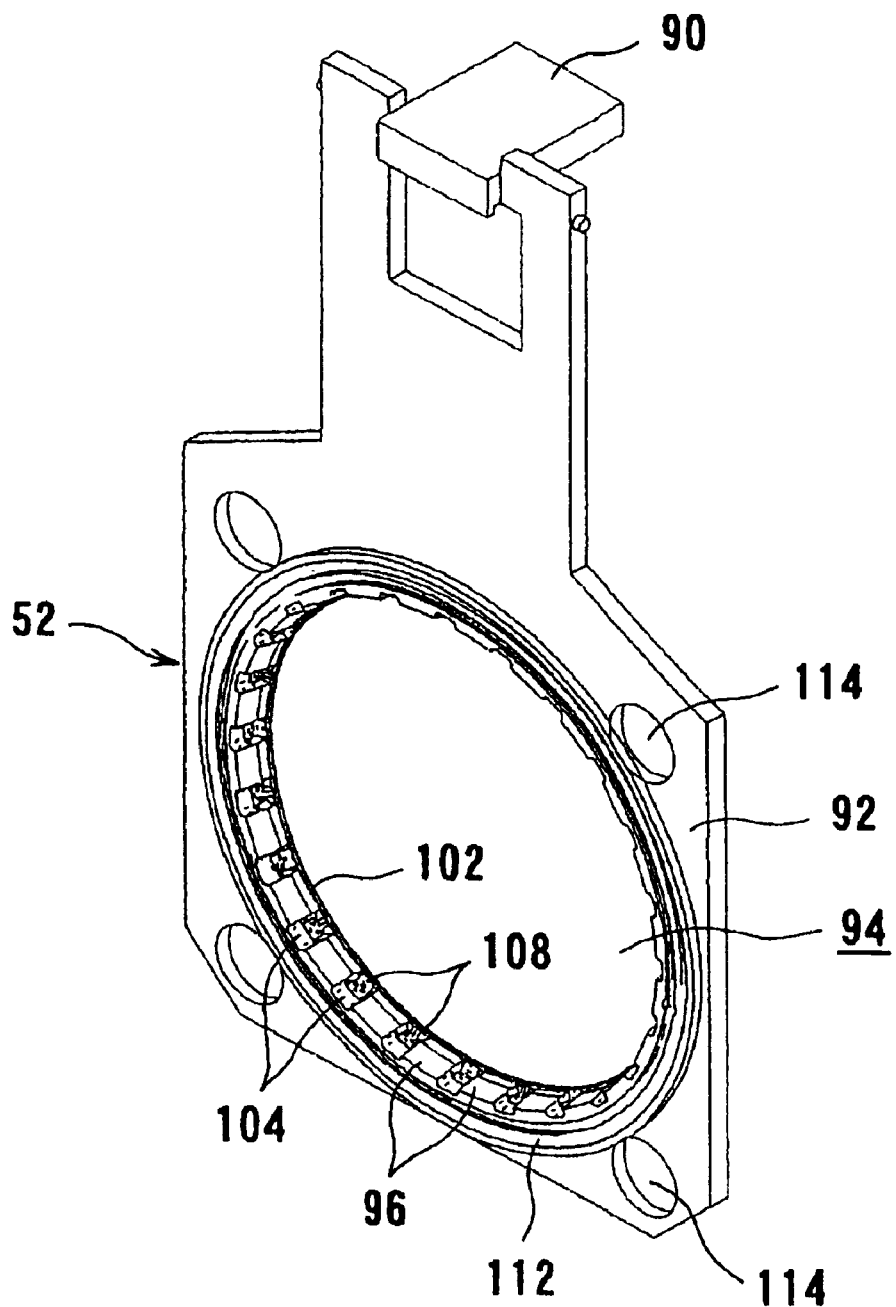
FIG. 5 is a perspective view of a cover of the substrate holder.

FIG. 1 shows an overall layout of components of a plating apparatus according to an embodiment of the present invention. As shown in FIG. 1, the plating apparatus has two cassette tables 10 for placing thereon respective cassettes which accommodate substrates, such as semiconductor wafers or the like, therein, an aligner 12 for aligning an orientation flat or notch of a substrate with a predetermined direction, and a rinser drier 14 for rinsing a plated substrate and rotating the rinsed plated substrate at a high speed to dry the substrate. The cassette tables 10 serve as a loading/unloading station for loading and unloading substrates. The plating apparatus also has a first transfer robot 16 movably disposed between the two cassette tables 10, the aligner 12, and the rinser drier 14, for transferring a substrate to and from the two cassette tables 10, the aligner 12, and the rinser drier 14. The first transfer robot 16 has a vacuum-attracting or gravity-positioning hand for transferring a substrate in the horizontal orientation.

In this embodiment, the plating apparatus has a total of four plating units 20 arranged in a linear array. Each of the plating units 20 comprises a plating tank 22 and a water cleaning tank 24 which are positioned adjacent to each other, and a substrate holder 26 disposed above the plating tank 22 and the water cleaning tank 24 for detachably holding a substrate in a vertical orientation. The substrate holder 26 is vertically movable by a vertically displacing mechanism 28 and laterally movable by a laterally displacing mechanism 30. The plating apparatus also has a second transfer robot 32 movably disposed on a front side of the plating units 20 for transferring a substrate to and from the aligner 12, the rinser drier 14, and the substrate holder 26 of each of the plating units 20. The second transfer robot 32 has e.g. a mechanical-chuck hand for holding a substrate, the hand having a turning mechanism 34 for turning the substrate through 90° between a horizontal orientation and a vertical orientation. The second transfer robot 32 transfers a substrate to and from the aligner 12 and the rinser drier 14 while holding the substrate in the horizontal orientation, and transfers a substrate to and from the substrate holder 26 while holding the substrate in the vertical orientation.

The plating tank 22 of each of the plating units 20 is arranged to supply a plating solution from its bottom into the space in the plating tank 22, and cause the supplied plating solution to overflow an overflow dam on the peripheral wall of the plating tank 22, while a substrate is being dipped in the plating solution in the plating tank 22 to plate the surface of the substrate. As shown in detail in FIG. 2, each of the plating units 20 has an anode 36 disposed in the plating tank 22 in a position facing the surface of a substrate held by the substrate holder 26 in the plating tank 22. The plating unit 20 also has a paddle 40 positioned between the substrate held by the substrate holder 26 and the anode 26 and actuatable by a paddle actuator 38 to reciprocally move parallel to the substrate to uniformize the flow of the plating solution, and a regulation plate 42 also positioned between the substrate and the anode 26 and having a central hole commensurate with the size of the substrate for lowering the electric potential of the circumferential edge of the substrate for uniformizing the thickness of a plated film on the substrate.

A pair of nozzle rods 44 is disposed along upper longitudinal opposite edges of the water cleaning tank 24. Each of the nozzle rods 44 has a plurality of ejection nozzles 46 spaced at a predetermined pitch for ejecting pure water inwardly and downwardly. After a substrate held by the substrate holder 26 is plated in the plating tank 22, the substrate is removed from the plating tank 22. The substrate holder 26 which is holding the plated substrate is then lowered into the water cleaning tank 24. While the substrate holder 26 is then being lifted, the ejection nozzles 46 eject pure water toward the substrate holder 26 to wash away the plating solution which has been attached to the surfaces of the substrate and the substrate holder 26. Alternatively, the water cleaning tank 24 may be filled with pure water, the substrate holder 26 which is holding the plated substrate may then be placed into the pure water in the water cleaning tank 24, and thereafter the pure water may quickly be drawn from the water cleaning tank 24 for thereby washing away, with the pure water, the plating solution which has been attached to the surfaces of the substrate and the substrate holder 26.

As shown in detail in FIGS. 3 through 7, the substrate holder 26 primarily comprises a base 50 and a cover 52 extending vertically and confronting each other. The base 50 is directly coupled to the vertically displacing mechanism 28, which is mounted on the laterally displacing mechanism 30. Therefore, when the vertically displacing mechanism 28 is actuated, the base 50 is vertically moved. When the laterally displacing mechanism 30 is actuated, the base 50 and the vertically displacing mechanism 28 are laterally moved in unison with each other.

The base 50 comprises a flat plate 54 and an upper end support 56 integrally joined to the upper end of the flat plate 54. The flat plate 54 is provided with an annular land 60 which is of a size commensurate with the size of a substrate to be held by the substrate holder 26. The annular land 60 has a support surface 58 for abutting against the outer circumferential marginal edge of the substrate. The land 60 also has an outer tapered surface 62 conically tapered off toward the cover 52. The flat plate 54 also is provided with a suction cup 64 disposed substantially centrally in the annular land 60 for provisionally attracting the substrate, and a plurality of suction cups 66 disposed respectively at four corners around the annular land 60 for finally attracting the substrate. These suction cups 64, 66 are of the vacuum-attracting type, for example.

Figure 6:
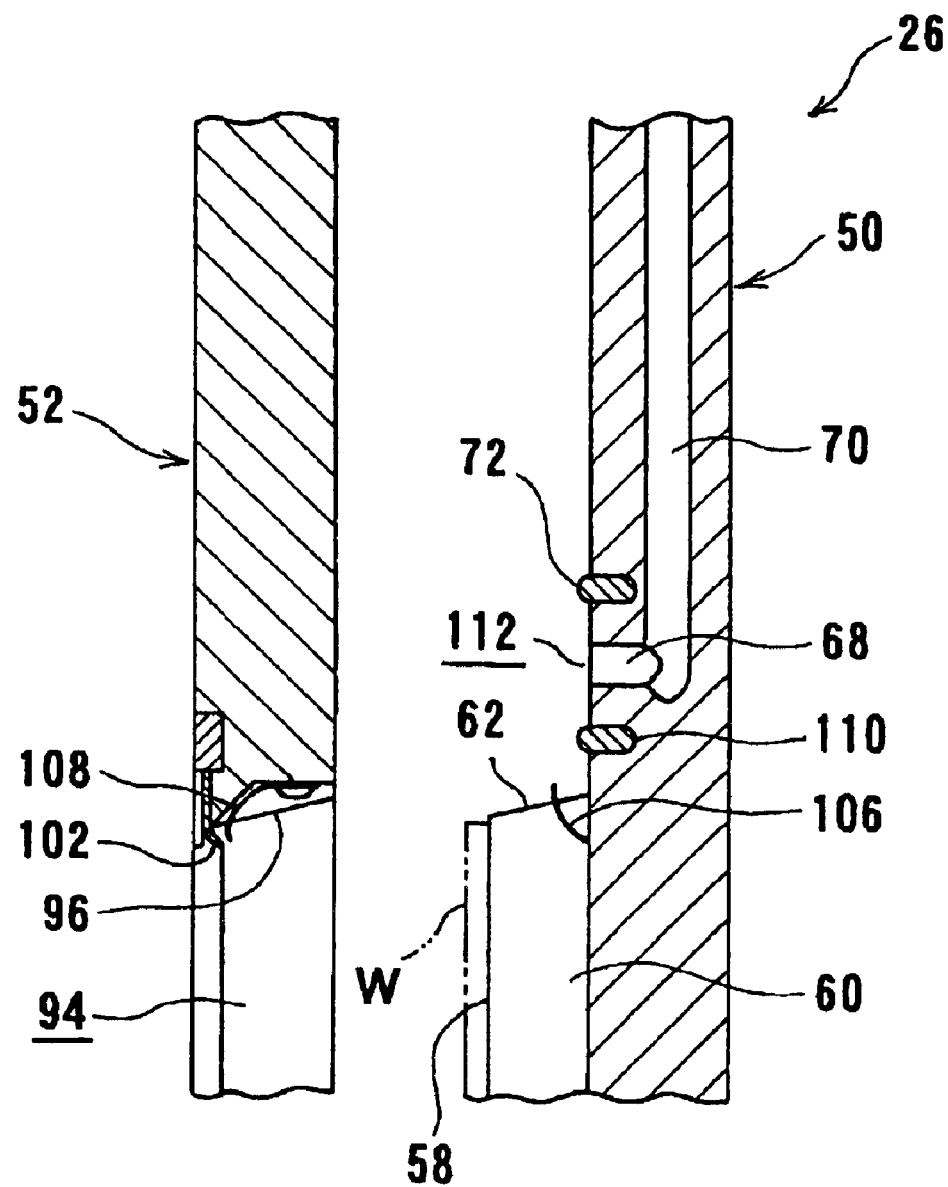
FIG. 6 is an enlarged fragmentary cross-sectional view of the substrate holder before the substrate holder holds a substrate.
Figure 7:
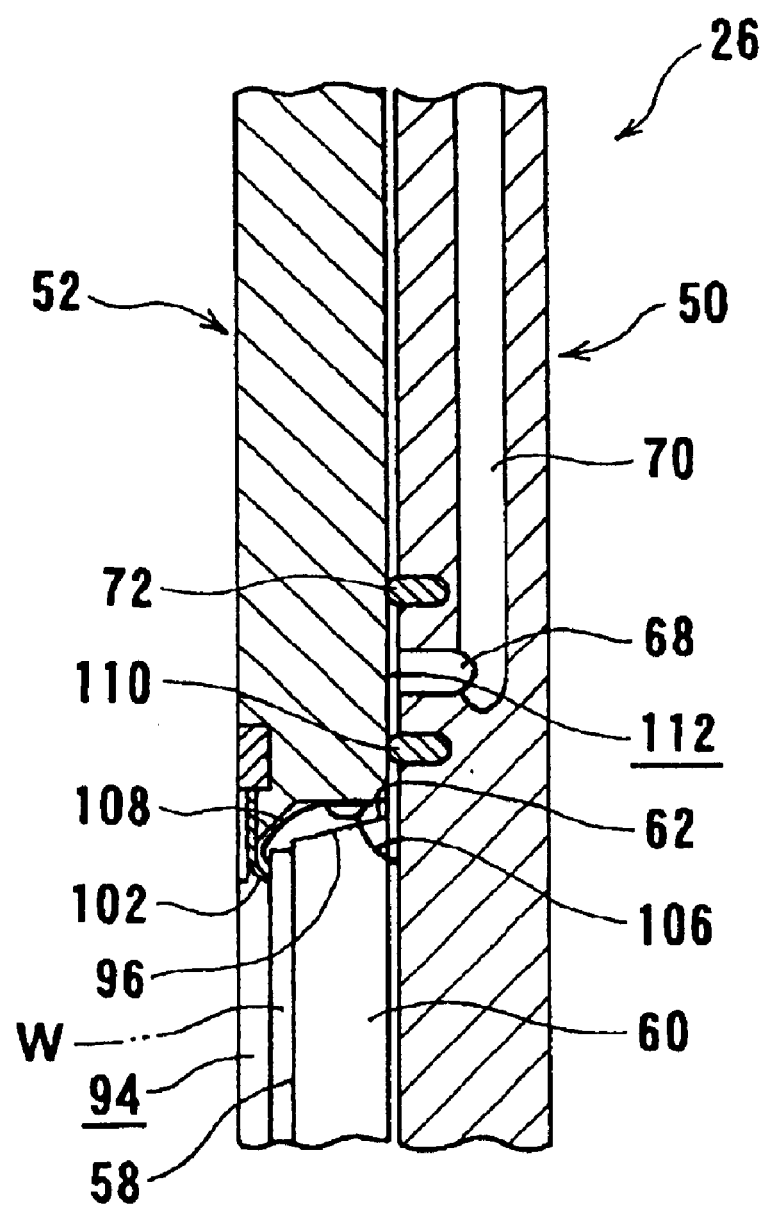
FIG. 7 is an enlarged fragmentary cross-sectional view of the substrate holder after the substrate holder has held a substrate.
Figure 8:
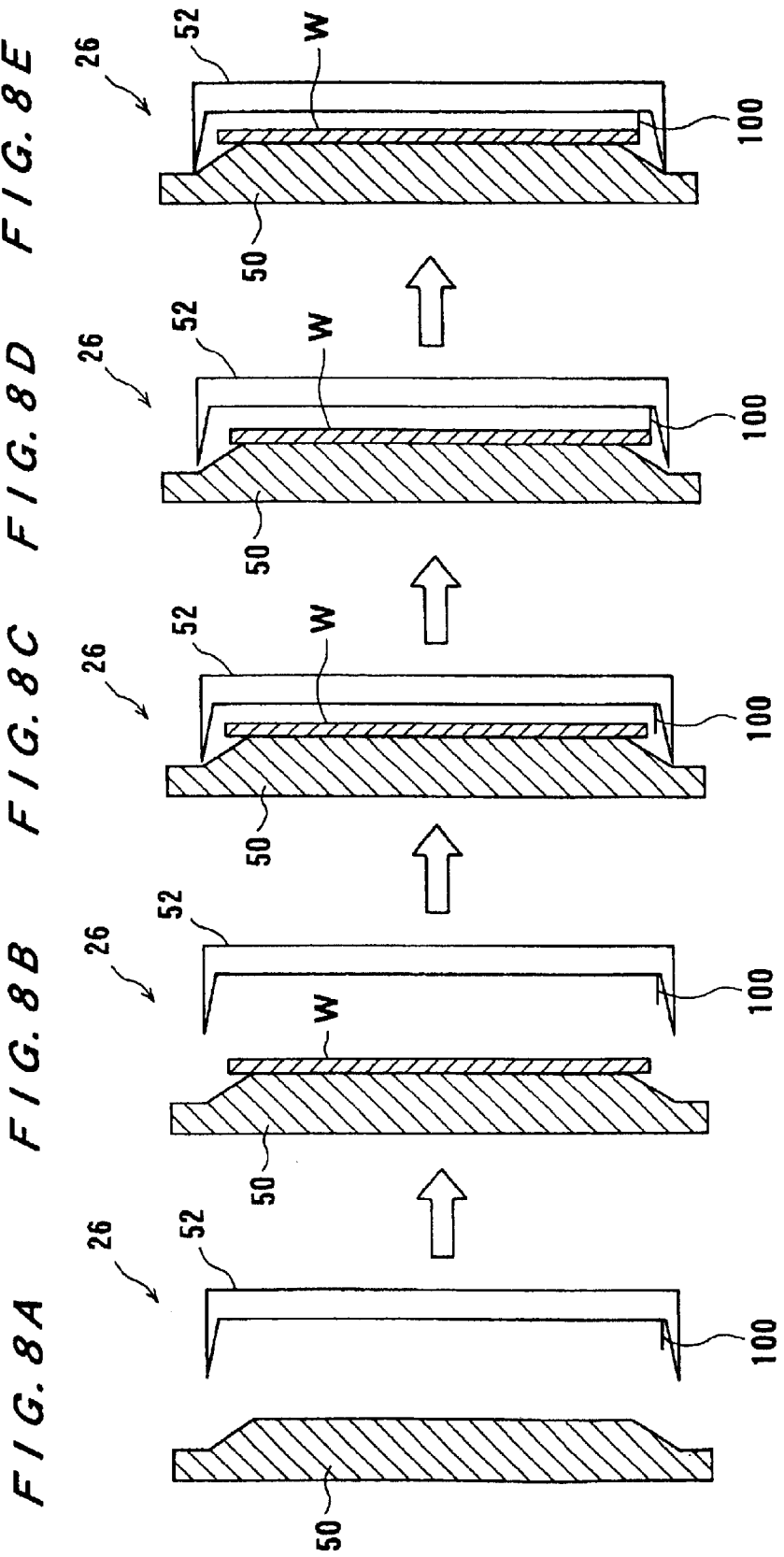
FIGS. 8A through 8E are cross-sectional views showing a process of holding a substrate with the substrate holder.

An annular continuous vacuum-attracting groove 68 is defined in the base 50 around the annular land 60. As shown in FIGS. 6 and 7, the vacuum-attracting groove 68 communicates with a suction hole 70 defined in and extending through the base 50. The suction hole 70 is connected to a vacuum pipe extending from a vacuum source, so that the vacuum-attracting groove 68 can be evacuated by the vacuum source. Although not shown, the suction cups 64, 66 are also connected to a vacuum source, so that regions surrounded by the peripheral walls of the suction cups 64, 66 can be evacuated by the vacuum source.

A seal member 72 in the shape of a rectangular frame is fixed to the surface of the flat plate 54 which faces the cover 52 in surrounding relation to the suction cups 66, for preventing the plating solution from entering through the gap between the base 50 and the cover 52. The annular land 60 has a plurality of recesses 74 defined therein and spaced at a predetermined pitch in the circumferential direction thereof. The recesses 74 accommodate therein respective electric conductors (electric contacts) 78 connected respectively to a plurality of wires 76 which extend in the base 50 and are electrically connected to a power source.

A linear displacement mechanism 84 is mounted on an upper surface of the upper end support 56 joined to the upper end of the flat plate 54. The linear displacement mechanism 84 comprises an actuator such as a cylinder or the like, a slider 80 coupled to the actuator, and a guide 82 for guiding the slider 80. When the actuator is operated, the slider 80 is linearly displaced along the guide 82 in directions transverse to the flat plate 54. The cover 52, on the other hand, comprises a support 90 fixed to an upper surface of the slider 80 of the linear displacement mechanism 84, and a flat cover plate 92 suspended from the support 90 downwardly. When the slider 80 is linearly moved by the actuator of the linear displacement mechanism 84, the cover 52 is linearly displaced toward and away from the base 50.

The flat cover plate 92 has a circular opening 94 defined centrally therein for exposing therethrough the surface to be plated of the substrate which is held by the substrate holder 26. The circular opening 94 has a peripheral wall including a tapered surface 96 closer to the base 50 and tapered off away from the base 50 for complementarily fitting over the tapered surface 62 of the land 60 of the base 50. The tapered surfaces 62, 96 jointly make up a positioning mechanism for positioning the base 50 and the cover 52 relatively to each other. Specifically, when the cover 52 is displaced into intimate contact with the base 50, the land 60 of the base 50 is fitted into the opening 94 in the cover 52. At this time, the tapered surface 96 of the opening 94 is guided by the tapered surface 62 of the land 60, positioning the cover 52 with respect to the base 50. As shown in FIGS. 8A through 8E, the cover 52 has a substrate retainer 100, which comprises two pins according to this embodiment, disposed on the surface of the cover 52 which faces the base 50 at a position near the opening 94. The substrate retainer 100 positions the substrate thereon for preventing the substrate from falling by gravity when the substrate is held between the base 50 and the cover 52. The positioning of the substrate is performed with substrate retainer 100.

The peripheral wall of the circular opening 94 also includes a flat surface next to the tapered surface 96 remotely from the base 50. The flat surface supports thereon a seal ring 102 for being pressed against the outer circumferential edge of the substrate to seal the same in a water-tight fashion when the substrate is held between the base 50 and the cover 52. The tapered surface 96 has a plurality of recesses 104 defined therein and spaced at a predetermined pitch in the circumferential direction of the tapered surface 96. The recesses 104 accommodate therein respective electrodes 108 for supplying electric energy to the substrate when the substrate is held between the base 50 and the cover 52. As shown in FIGS. 6 and 7, the electrodes 108 are electrically connected to the respective electric conductors 78 (see FIG. 4) on the base 50 through respective tongues 106 on the base 50.

An O-ring 110 is fixedly mounted on the base 50 radially inwardly of the vacuum-attracting groove 68 defined in the base 50 and radially spaced a predetermined distance from the seal member 72. A vacuum-attracting area 112 is provided between the O-ring 110 and the seal member 72. When the base 50 and the cover 52 are put together, the tip ends of the O-ring 110 and the seal member 72 are held against the surface of the cover 52, and the vacuum-attracting groove 68 and the vacuum-attracting area 112 which communicates with the vacuum-attracting groove 68 are evacuated by the vacuum source connected to the vacuum-attracting groove 68, thereby compressing the tip ends of the O-ring 110 and the seal member 72 to provide a water-tight seal between the base 50 and the cover 52.

The flat cover plate 92 has a plurality of vacuum-attracting cavities 114 defined therein at respective positions aligned with the suction cups 66 for finally attracting the substrate on the base 50. The vacuum-attracting cavities 114 are complementary in size and profile to the suction cups 66. When the base 50 and the cover 52 are put together, the suction cups 66 have respective ends positioned in the vacuum-attracting cavities 114. A vacuum developed in the suction cups 66 then attracts the cavities 114 and hence the cover 52 to the base 50.

A process of holding a substrate W with the substrate holder 26 will be described below with reference to FIGS. 8A through 8E.

As shown in FIG. 8A, the base 50 and the cover 52 are spaced a predetermined distance from each other. Then, the substrate W held vertically by the second transfer robot 32 is positioned between the base 50 and the cover 52. After the substrate W is brought into abutment against the surface of the base 50 by the second transfer robot 32, the suction cup 64 is evacuated to provisionally attract the substrate W to the surface of the base 50, as shown in FIG. 8B.

In this state, as shown in FIG. 8C, the cover 52 is moved toward the base 50 by the linear displacement mechanism 84 until the substrate retainer 100 of the cover 52 is positioned beneath the substrate W provisionally secured in position by the suction cup 64 of the base 50. Then, as shown in FIG. 8D, the suction cup 64 is inactivated to release the substrate W, which then falls by gravity onto the substrate retainer 100. The substrate W is now positioned on its edge.

As shown in FIG. 8E, the cover 52 is further moved toward the base 50. At this time, the tapered surface 96 of the opening 94 in the cover 52 is guided onto the tapered surface 62 of the land 60 of the base 50, thus positioning the cover 52 with respect to the base 50. Therefore, the substrate W which has been released from the suction cup 64 is placed in its free state between the base 50 and the cover 52. When the ends of the suction cups 66 enter the vacuum-attracting cavities 114 defined in the flat cover plate 92, for example, the linear displacement mechanism 84 is inactivated to stop the cover 52 against movement toward the base 50.

Then, the suction cups 66 are evacuated to attract the cover 52 to the base 50, reliably holding the substrate W between the base 50 and the cover 52. The vacuum-attracting groove 68 and the vacuum-attracting area 112 which is provided between the 0-ring 110 and the seal member 72 and communicates with the vacuum-attracting groove 68 are evacuated to seal the flat cover plate 92 around the opening 94 in a water-tight fashion with the seal ring 102.

At this time, as shown in FIG. 7, the seal member 72 of the base 50 is pressed against the surface of the flat cover plate 92 to seal between the base 50 and the surface of the flat cover plate 92, thereby to prevent a plating solution from entering through the gap between the base 50 and the cover 52. Furthermore, the tip end of the seal ring 102 disposed within the opening 94 defined in the flat cover plate 92 is pressed against the outer circumferential edge of the substrate W held between the base 50 and the cover 52, thus sealing the outer circumferential edge of the substrate W with the seal ring 102. Simultaneously, the tongues 106, which are connected to the electric conductors 78 connected to the wires 76, are pressed against the respective electrodes 108 on the cover 52, and the outer circumferential edge of the substrate W held between the base 50 and the cover 52 is pressed against the electrodes 108. Thus, the substrate W is supplied with electric energy from the power source.

Thus, the tongues 106 and the electrodes 108 for supplying electric energy to the substrate W are exposed within a region that is sealed between the seal member 72 and the seal ring 102. Therefore, the tongues 106 and the electrodes 108 are reliably prevented from contacting the plating solution.

The surface to be plated of the substrate W is exposed out through the opening 94 of the cover 52. The outer circumferential edge of the substrate W is sealed by the seal ring 102 against entry of the plating solution. The gap between the base 50 and the cover 52 is sealed by a dual-seal structure made up of the seal member 72 and the O-ring 110.

After the substrate W is plated, the substrate W held by the substrate holder 26 will be released therefrom by a process which is essentially the reversal of the above process, and transferred to the second transfer robot 32.

Figure 11A:
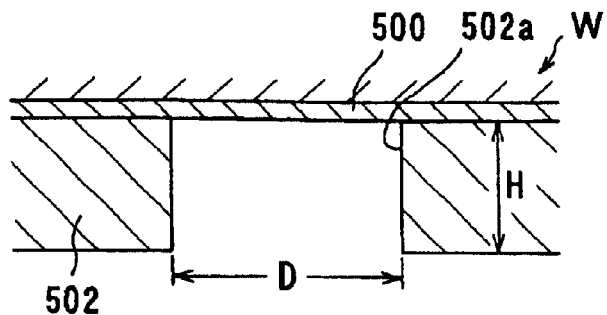
FIGS. 11A through 11E are cross-sectional views showing a process of forming a bump (protrusive electrode) on a substrate.

A plating process carried out by the above plating apparatus will be described, as a process of forming a bump (protrusive electrode) on a substrate, below with reference to FIGS. 11A through 11E. As shown in FIG. 11A, a seed layer 500 as an electric supply layer is formed on the surface of a substrate W. After the entire surface of the seed layer 500 is coated with a resist 502 having a height H of e.g. 20–120 $\mu$m, an opening 502a having a diameter D of e.g. 20–200 $\mu$m is formed at a prescribed position in the resist 502. The substrate W is then placed in a cassette in which the surface to be plated of the substrate W faces upwardly. Thereafter, the cassette is placed on one of the cassette tables 10.

The first transfer robot 16 takes out one substrate W from the cassette on the cassette table 10, and puts the substrate W on the aligner 12, which aligns an orientation flat or notch of the substrate W with a predetermined direction. The substrate W thus oriented by the aligner 12 is taken from the aligner 12 by the second transfer robot 32, and turned 90° from the horizontal orientation to the vertical orientation by the turning mechanism 34. The second transfer robot 32 then transfers the turned substrate W to the substrate holder 26 of a selected one of the plating units 20.

In the present embodiment, the substrate W is transferred to the substrate holder 26 above the water cleaning tank 24. Specifically, the substrate holder 26 has been lifted by the vertically displacing mechanism 28 and laterally displaced to the water cleaning tank 24 side by the laterally displacing mechanism 30, and receives the substrate W from the second transfer robot 32 and holds the substrate W in the vertical orientation. At this time, the surface to be plated of the substrate W held by the substrate holder 26 is exposed through the opening 94 in the cover 52, and the substrate W has its outer circumferential edge sealed by the seal ring 102, with the seed layer 500 contacting the electrodes 108 for being supplied with an electric current therefrom.

The substrate holder 26 which is holding the substrate W in the vertical orientation is moved to the plating tank 22 side by the laterally displacing mechanism 30. The plating tank 22 has been supplied with a plating solution from its bottom such that the plating solution overflows the overflow dam on the peripheral wall of the plating tank 22. Then, the substrate holder 26 which is holding the substrate W is lowered into the plating tank 22 by the vertically displacing mechanism 28, dipping the substrate W in the plating solution. A plating voltage is applied between the anode 36 and the substrate W, and at the same time the paddle actuator 38 moves the paddle 40 reciprocally parallel to the surface of the substrate W, thus plating the surface of the substrate W. At this time, the seed layer 500 (see FIG. 11A) of the substrate W is supplied with an electric current through the wires 76, the electric conductors 78, the tongues 106, and the electrodes 108.

After the substrate W is plated, the application of the plating voltage is stopped, and the paddle actuator 38 is inactivated to stop moving the paddle 40. The substrate holder 26 which is holding the plated substrate W is lifted out of the plating tank 22 by the vertically displacing mechanism 28.

Thereafter, the substrate holder 26 which is holding the substrate W in the vertical orientation is moved to the water cleaning tank 24 side by the laterally displacing mechanism 30. Then, the substrate holder 26 which is holding the substrate W is lowered into the water cleaning tank 24 by the vertically displacing mechanism 28. Now, while the substrate holder 26 is being lifted, the ejection nozzles 46 eject pure water toward the substrate holder 26 to wash away the plating solution which has been attached to the surfaces of the substrate W and the substrate holder 26. Alternatively, as described above, the water cleaning tank 24 maybe filled with pure water, the substrate holder 26 which is holding the substrate W may then be placed into the pure water in the water cleaning tank 24, and thereafter the pure water may quickly be drawn from the water cleaning tank 24 for thereby washing away, with the pure water, the plating solution which has been attached to the surfaces of the substrate W and the substrate holder 26. As a further alternative, a combination of the above-described two cleaning schemes may be used to clean the substrate W and the substrate holder 26.

The second transfer robot 32 receives the cleaned substrate W in the vertical orientation from the substrate holder 26 above the water cleaning tank 24. Then, the turning mechanism 34 of the second transfer robot 32 turns the substrate W through 90° from the vertical orientation to the horizontal orientation. The second transfer robot 32 transfers the turned substrate W to the rinser drier 14 and places the substrate W in the rinser drier 14.

Figure 11B:
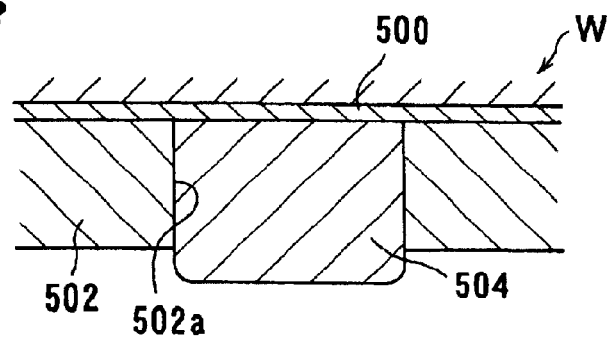

The rinser drier 14 rinses the substrate W and spins the substrate W at a high speed to spin dry the substrate W. The dried substrate W is then transferred from the rinser drier 14 back in to the cassette on the cassette table 10 by the first transfer robot 16 to complete the process. As shown in FIG. 11B, the substrate W plated and processed, as described above, has a plated film 504 grown in the opening 502a formed in the resist 502.

Figure 11C:
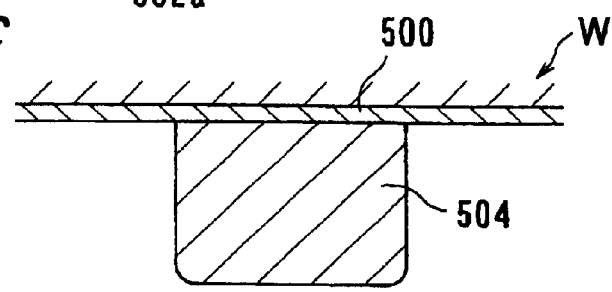
Figure 11D:
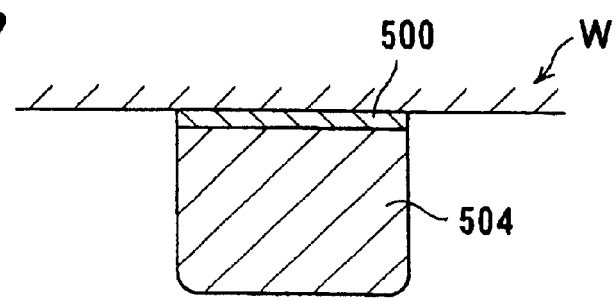
Figure 11E:
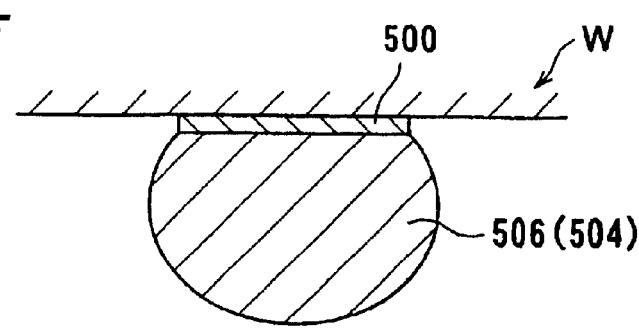

Thereafter, the dried substrate W is dipped in a solvent, such as acetone or the like, that is maintained at a temperature of 50–60° C., for example, whereupon the resist 502 is removed from the substrate W, as shown in FIG. 11C. Then, as shown in FIG. 11D, the unnecessary seed layer 500 exposed after the plating process is removed from the substrate W. Thereafter, heat is applied to reflow the plated film 504 on the substrate W, thus forming a bump 506 which is made round under surface tension as shown in FIG. 11E. Then, the substrate W is annealed at a temperature of, for example, 100° C. or higher, thereby removing residual stress in the bump 506.

When the substrate holder 26 is not in use, i.e., when the substrate holder 26 is not holding a substrate, the substrate holder 26 is dipped in pure water filled in the water cleaning tank 24. When the substrate holder 26 is dipped in pure water, any plating solution attached to the substrate holder 26 is solidified on the surface of the substrate holder 26 and prevented from producing particles which would otherwise adversely affect the plating process on substrates W.

Figure 9:
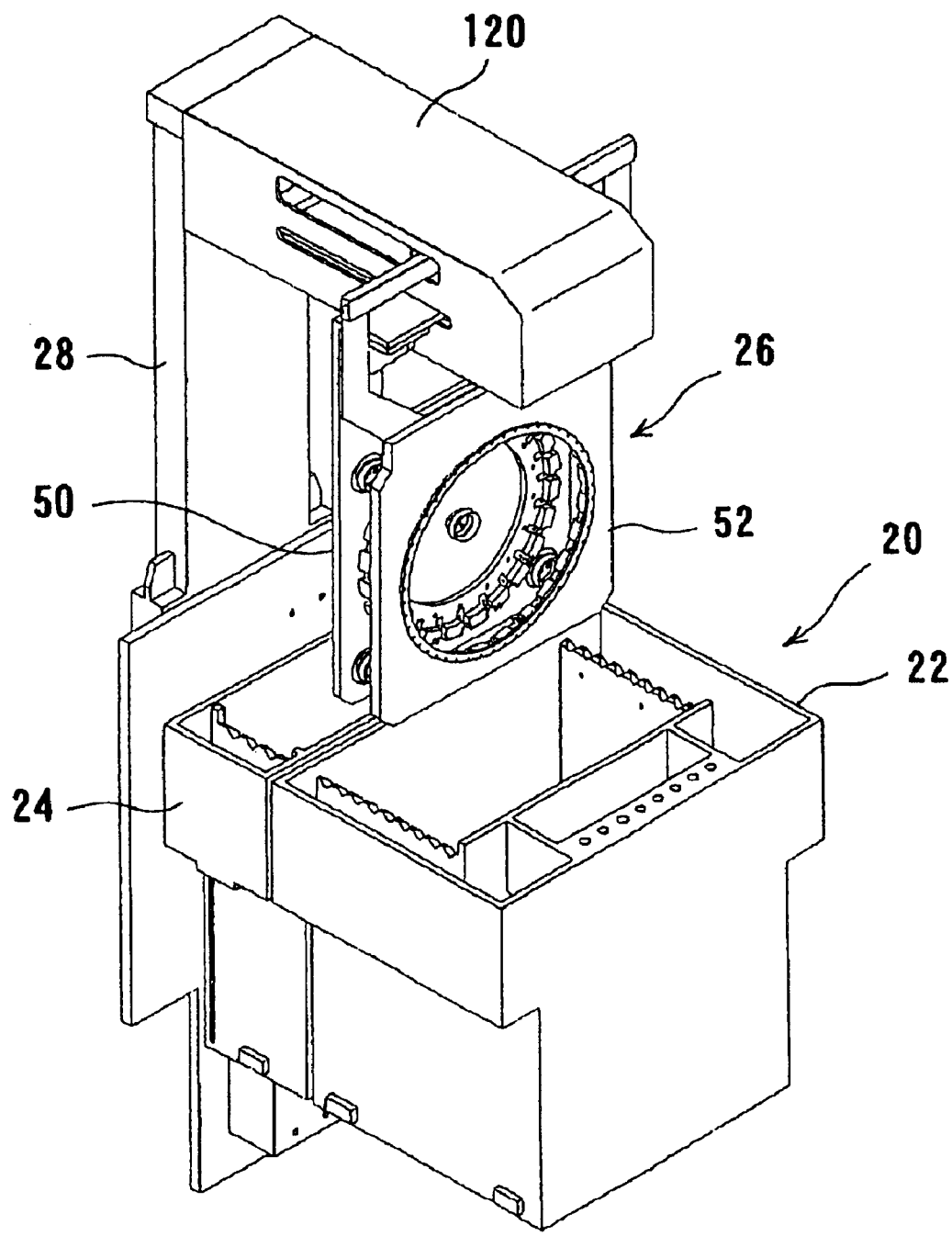
FIG. 9 is a perspective view of a plating unit, as seen from its front side, according to another embodiment of the present invention.
Figure 10:
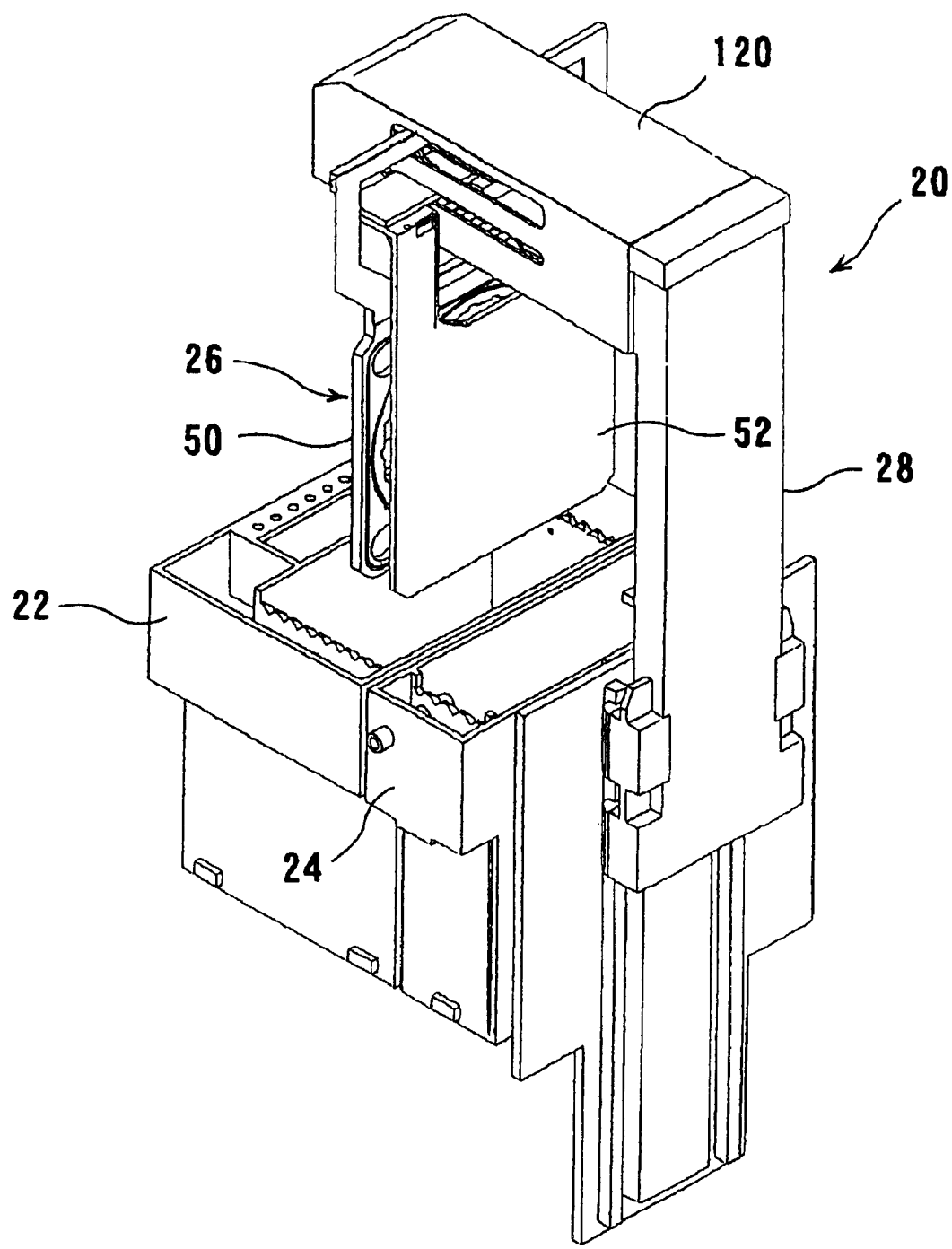
FIG. 10 is a perspective view of the plating unit, as seen from its rear side, according to the other embodiment of the present invention.

FIGS. 9 and 10 show a plating unit 20 according to another embodiment of the present invention. The plating unit 20 comprises a plating tank 22 and a water cleaning tank 24 which are positioned adjacent to each other, and a substrate holder 26 disposed above the plating tank 22 and the water cleaning tank 24 for detachably holding a substrate in a vertical orientation. The substrate holder 26 is vertically movable by a vertically displacing mechanism 28 and movable back and forth by a back-and-forth displacing mechanism 120. When the back-and-forth displacing mechanism 120 is actuated, the substrate holder 26 is moved back and forth between the plating tank 22 and the water cleaning tank 24. Other structural details of the plating unit 20 shown in FIGS. 9 and 10 are identical to those of the plating unit 20 shown in FIGS. 1 through 8.

As described hereinabove, the substrate holder 26 according to the present invention can hold the substrate W by attracting the cover 52 to the base 50 with the substrate W sandwiched therebetween, without turning or twisting the cover 52 with respect to the base 50. Therefore, when the substrate holder 26 holds the substrate W, the cover 52 and components combined therewith are prevented from being unduly deformed and the seal ring 102 is also prevented from being strained. Consequently, the seal ring 102 can fully seal the outer circumferential marginal edge of the substrate W. The plating apparatus has a plurality of such substrate holders 26 associated with respective plating units 20 and plates substrates W which are being detachably held in the vertical orientation by the respective substrate holders 26. The plating apparatus thus arranged is suitable for the production of a small lot of substrate products, and may be relatively small in size.

Although certain preferred embodiments of the present invention have been shown and described in detail, it should be understood that various changes and modifications may be made therein without departing from the scope of the appended claims.

What is claimed is:

1. A substrate holder for holding a substrate, comprising:
    a seal ring for sealing an outer circumferential edge and a reverse side of the substrate, while exposing a surface of the substrate;
    a base;
    a cover having an opening defined therein; and
    an attracting mechanism for coupling said base and said cover to each other to hold said substrate positioned between said base and said cover, with said surface of the substrate being exposed through said opening.

2. A substrate holder according to claim 1, wherein said attracting mechanism comprises a vacuum attracting mechanism.

3. A substrate holder according to claim 1, wherein said base has a provisionally supporting mechanism for provisionally supporting said substrate on said base.

4. A substrate holder according to claim 1, further comprising:
    a positioning mechanism provided between said base and said cover for positioning said substrate disposed and held between said base and said cover.

5. A substrate holder for holding a substrate, comprising:
    a seal ring for sealing an outer circumferential edge and a reverse side of the substrate, while exposing a surface to be plated of the substrate; and
    a base and a cover lying vertically and confronting each other;
    wherein said base is adapted to attract the substrate in a vertical orientation under vacuum, and secure said cover to said base in covering relation to the surface of the substrate with said seal ring pressed against said substrate.

6. A substrate holder according to claim 5, wherein said cover has a positioning mechanism for receiving and positioning said substrate attracted under vacuum by said base.

* * * * *